US011380577B2

(12) United States Patent
Benaissa et al.

(10) Patent No.: US 11,380,577 B2
(45) Date of Patent: Jul. 5, 2022

(54) METHOD FOR TRANSFERRING A THIN LAYER USING A FILLED PRECERAMIC POLYMER

(71) Applicant: COMMISSARIAT À L'ÉNERGIE ATOMIQUE ET AUX ÉNERGIES ALTERNATIVES, Paris (FR)

(72) Inventors: Lamine Benaissa, Grenoble (FR); Marilyne Roumaine, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/078,488

(22) Filed: Oct. 23, 2020

(65) Prior Publication Data
US 2021/0125857 A1      Apr. 29, 2021

(30) Foreign Application Priority Data

Oct. 28, 2019   (FR) ...................................... 1912056

(51) Int. Cl.
*H01L 21/762* (2006.01)
*H01L 23/00* (2006.01)

(52) U.S. Cl.
CPC ........ *H01L 21/76254* (2013.01); *H01L 24/83* (2013.01); *H01L 2224/83203* (2013.01)

(58) Field of Classification Search
CPC ........... H01L 21/7624; H01L 21/76251; H01L 21/76254; H01L 21/76259;

(Continued)

(56) References Cited

U.S. PATENT DOCUMENTS

2013/0156989 A1  6/2013  Moriceau et al.
2016/0092320 A1  3/2016  Baca
(Continued)

FOREIGN PATENT DOCUMENTS

EP          260825 B1     4/2018

OTHER PUBLICATIONS

Search Report for French Application No. FR 1912056 dated Jul. 14, 2020.

(Continued)

*Primary Examiner* — Julio J Maldonado
*Assistant Examiner* — Stanetta D Isaac
(74) *Attorney, Agent, or Firm* — Pearne & Gordon LLP

(57) ABSTRACT

A method for transferring, from a donor substrate to a carrier substrate, a thin layer having a first coefficient of thermal expansion. This method comprises: —forming an embrittlement plane in the donor substrate; —forming an electrically insulating layer on the surface of the donor substrate and/or of the carrier substrate; —producing an assembly by placing the donor substrate and the carrier substrate in contact with one another via the insulating layer; —separating the assembly by fracturing along the embrittlement plane. In order to form the electrically insulating layer, the method comprises coating the donor substrate and/or the carrier substrate with a coating formulation including a composite material formed by a matrix made of a particle-filled preceramic polymer, the composite material having a second coefficient of thermal expansion, the second coefficient of thermal expansion differing from the first coefficient of thermal expansion by no more than 20% of the first coefficient of thermal expansion.

10 Claims, 2 Drawing Sheets

(58) Field of Classification Search
CPC .......... H01L 2224/83203; H01L 27/12; H01L 27/1203; H01L 27/1207
See application file for complete search history.

(56) References Cited

U.S. PATENT DOCUMENTS

| | | |
|---|---|---|
| 2016/0126215 A1 | 5/2016 | Imbert et al. |
| 2016/0251250 A1 | 9/2016 | Benaissa et al. |
| 2016/0257597 A1 | 9/2016 | Benaissa et al. |
| 2017/0025377 A1 | 1/2017 | Gondcharton et al. |
| 2017/0033010 A1* | 2/2017 | Rupp .................. H01L 21/7813 |
| 2017/0103936 A1 | 4/2017 | Soupremanien et al. |
| 2017/0236800 A1 | 8/2017 | Gondcharton et al. |
| 2017/0309517 A1 | 10/2017 | Ruppp et al. |
| 2018/0358381 A1 | 12/2018 | Lamy et al. |
| 2019/0198397 A1 | 6/2019 | Andrieu et al. |
| 2020/0020561 A1 | 1/2020 | Benaissa et al. |
| 2020/0020663 A1 | 1/2020 | Benaissa et al. |
| 2020/0161336 A1 | 5/2020 | Lamy et al. |

OTHER PUBLICATIONS

U.S. Appl. No. 16/956,375 entitled "Method for the Production of a Bulk Acoustic Wave Resonator With a Reduced Parasitic Capacitance", filed Jun. 19, 2020 (37 pages).

* cited by examiner

METHOD FOR TRANSFERRING A THIN LAYER USING A FILLED PRECERAMIC POLYMER

CROSS-REFERENCE TO RELATED APPLICATIONS

This application claims priority from French Patent Application No. 1912056 filed on Oct. 28, 2019. The content of this application is incorporated herein by reference in its entirety.

TECHNICAL FIELD

The field of the invention is that of methods for transferring a semiconductor layer from a donor substrate to a carrier substrate which implement a fracture along an embrittlement plane formed by implanting species in the donor substrate. Such methods are used to produce advanced substrates for microelectronics, photonics or power electronics, in particular to produce SeOI (Semiconductor On Insulator) substrates comprising a semiconductor layer separated from the carrier substrate by a buried insulator layer.

PRIOR ART

Smart Cut™ technology constitutes a well-known technique for transferring thin layers of semiconductor materials. According to this technique, ion species such as hydrogen and/or helium are implanted in a donor substrate to form an embrittlement plane. The donor substrate is then placed in contact with a carrier substrate, for example by direct bonding. This technique then involves developing the defects generated at the embrittlement plane. This development requires an input of energy, generally taking place by means of a heat treatment at several hundred degrees, typically 500° C., for several tens of minutes. This results in the formation of a confined layer of cavities and microcracks in which a fracture will be initiated and propagate. This fracture separates the donor substrate along the embrittlement plane and a thin layer of the donor substrate is thus transferred onto the carrier substrate.

Smart Cut™ technology makes use of standard methods in the microelectronics industry and is thus intrinsically limited to the capacities of these methods.

This is the case for the thickness that can be achieved for the layers which, as with the buried insulator layer, are deposited according to conventional deposition methods such as physical vapour deposition (PVD), chemical vapour deposition (CVD), deposition by evaporation or deposition by epitaxy. However, a sufficiently thick buried insulator layer would do away with the need for an expensive, high-resistivity carrier substrate in radiofrequency applications, for example 5G networks, as well as the potential need for so-called trap-rich layers, thus improving performance and reducing costs. A sufficiently thick buried insulator layer would further increase the withstand voltage of power components.

The assembly of the implanted donor substrate and of the carrier substrate by means of direct bonding has the drawback of requiring the two surfaces to be bonded to have a high flatness and low roughness. This must thus be accompanied by surface preparation methods which are inevitably expensive.

The buried insulator layer also imposes restrictions since it must have both a coefficient of thermal expansion that is close to that of the thin layer transferred and good temperature behaviour to allow the transfer method to be implemented as well as a high-temperature anneal (from 400° C. to 1000° C. depending on the materials) for recovery of the defects generated by the implantation in the thin layer transferred. These restrictions thus rule out the use of conventional polymers, such as the DVS-bis-BCB, polyimides and photosensitive polymers mentioned in the European patent document EP 2 608 252 B1.

DESCRIPTION OF THE INVENTION

The purpose of the invention is to overcome the aforementioned drawbacks of the standard methods used in the microelectronics industry while satisfying thermal restrictions concerning the buried insulator layer. For this purpose, the invention proposes a method for transferring, from a donor substrate to a carrier substrate, a thin layer having a first coefficient of thermal expansion, comprising the steps of:

forming an embrittlement plane in the donor substrate;
forming an electrically insulating layer on the surface of the donor substrate and/or of the carrier substrate;
producing an assembly by placing the donor substrate and the carrier substrate in contact with one another via the electrically insulating layer; and
separating the assembly by fracturing along the embrittlement plane.

The formation of the insulating layer comprises coating the donor substrate and/or the carrier substrate with a coating formulation including a composite material formed by a matrix made of a particle-filled preceramic polymer. The composite material has a second coefficient of thermal expansion, the second coefficient of thermal expansion differing from the first coefficient of thermal expansion by no more than 20% of the first coefficient of thermal expansion.

Some preferred, however non-limiting aspects of this method are as follows:

the coating is produced such that the electrically insulating layer has a thickness of greater than 20 µm;
the coating is produced such that the electrically insulating layer has a thickness of less than 300 µm;
the production of the assembly comprises thermocompression of the donor substrate and of the carrier substrate;
thermocompression is carried out at a pressure that lies in the range of 10 kN to 30 kN;
thermocompression is carried out at a temperature greater than 100° C.;
separation comprises an annealing carried out at a temperature that is greater than the thermocompression temperature;
said coating is produced on a dielectric layer previously deposited on the donor substrate;
said coating formulation has a filling factor of greater than 50 vol. %;
the carrier substrate is made of a polycrystalline material.

BRIEF DESCRIPTION OF THE FIGURES

Other aspects, purposes, advantages and features of the invention will be better understood upon reading the following detailed description given of non-limiting preferred embodiments of the invention, provided for illustration purposes, with reference to the accompanying figures which represent different consecutive steps of the method according to the invention and in which.

DETAILED DESCRIPTION

The invention relates to a method for transferring, from a donor substrate to a carrier substrate, a thin layer having a first coefficient of thermal expansion. The thin layer is, for example, a silicon, germanium, or silicon carbide layer or a layer of an III-V material. The carrier substrate can be made of a monocrystalline material. Alternatively, the carrier substrate can be a low-cost substrate made of a polycrystalline material, such as polycrystalline silicon or polycrystalline silicon carbide.

Figure 1:
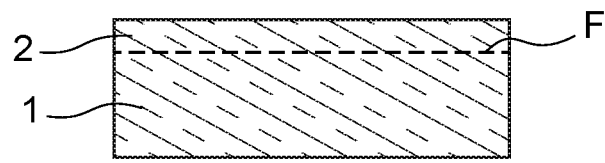
FIG. 1 shows the formation of the embrittlement plane.

With reference to FIG. 1, this method comprises a step of forming an embrittlement plane F in the thickness of the donor substrate 1 by means of ion species implantation, for example with hydrogen and/or helium. This embrittlement plane delimits a superficial portion of the donor substrate which will form the thin layer to be transferred 2 from a bulk part of the donor substrate. The thickness of this superficial portion lies, for example, in the range of 10 nm to 3 µm.

Figure 2:
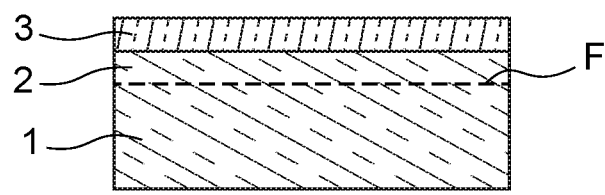
FIG. 2 shows the deposition of a dielectric layer.

With reference to FIG. 2, this method can comprise the deposition of a dielectric layer 3 on the surface of either or both the donor substrate and the carrier substrate. This dielectric layer 3 contributes to the stiffening effect during separation at the embrittlement plane.

This dielectric layer 3 is deposited according to a conventional deposition method, at a temperature that is less than a temperature (typically greater than 300° C.) that could, when deposited on the implanted donor substrate, cause bubbling, i.e. maturation of microcavities in the embrittlement plane F which, in the absence of a stiffener mounted on the donor substrate, would result in a deformation of the surface thereof capable of hindering assembly with the carrier substrate.

Figure 3:
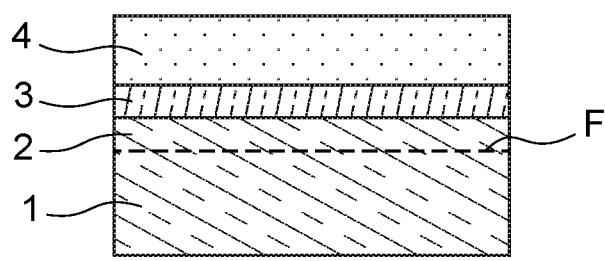
FIG. 3 shows the coating with the electrically insulating layer made of a composite material.

With reference to FIG. 3, the method comprises a step of forming an electrically insulating layer 4 on the surface of the donor substrate and/or of the carrier substrate. In accordance with the invention, the formation of this insulating layer 4 comprises coating the donor substrate and/or the carrier substrate with a coating formulation. This coating formulation comprises, or where appropriate consists of, a composite material constituted by a particle-filled preceramic polymer matrix.

In one possible embodiment shown in FIGS. 1 and 2, the dielectric layer 3 and the electrically insulating layer 4 are successively formed on the donor substrate. In one alternative embodiment, the electrically insulating layer 4 and the dielectric layer 3 are successively formed on the carrier substrate. In yet another embodiment, the dielectric layer 3 is formed on the donor substrate and the electrically insulating layer 4 is formed on the carrier substrate.

The preceramic polymer is, for example, a silicon-based polymer, such as a polysiloxane, a polysilsesquioxane, a polycarbosiloxane, a polycarbosilane, a polysilylcarbodiimide, a polysilsesquicarbodiimide, a polysilsesquiazane, a polysilazane, a polyborosilazane, a polyborosilane or a polyborosiloxane. The choice of the preceramic polymer can be made as a function of the material of the thin layer transferred, for example by choosing a carbosilane base for a thin layer made of silicon carbide or a siloxane or silazane base for a thin layer made of silicon or oxidised silicon or silicon nitride.

A preceramic polymer is an organic/inorganic polymer that is generally used to produce, after heat treatment at a high temperature, ceramic objects referred to as PDCs (polymer-derived ceramics). Such a preceramic polymer can be applied in the form of a coating. It is present in liquid form or is soluble in organic solvents and can be deposited on a substrate in vapour phase or liquid form. Any polymer processing technique can be used, such as spin coating, dip coating, spraying, screen printing or tape casting.

Within the scope of the invention, the coating is preferably produced such that the electrically insulating layer 4 is a thick layer with a thickness of greater than 20 µm. This coating can further be produced such that the electrically insulating layer 4 has a thickness of less than 300 µm.

According to the invention, the composite material forming the electrically insulating layer and constituted by a particle-filled preceramic polymer matrix has a second coefficient of thermal expansion. This second coefficient of thermal expansion differs from the first coefficient of thermal expansion, i.e. from that of the thin layer, by no more than 20% of the first coefficient of thermal expansion.

The particles are typically made of electrically insulating or semiconductor materials. In addition to the thermomechanical properties thereof, these particles can have other advantageous physical properties such as, for example, thermal, ferroelectric, magnetic or optical properties.

These particles are preferably mixed with the matrix such that the coating formulation has a filling factor of greater than 50 vol. %. It is possible, for instance to improve thermal properties, to use formulations containing a plurality of particle sizes and shapes to favour percolating paths.

The temperature behaviour of the electrically insulating layer 4, which is thermally conductive, is excellent (for example it withstands, in adhesive form, temperatures in excess of 350° C.) and the coefficient of thermal expansion thereof is close enough to that of the thin layer to allow the thin layer transferred to undergo high-temperature heat treatments, such as recovery of the defects generated by the implantation.

Thus, the electrically insulating layer 4 is made of a material that is compatible in terms of CTE with the thin layer (this property also being a function of the thickness of the deposition) and that is modular in terms of the electric and thermal properties as a function of the filler added. Moreover, this material contributes to the stiffening effect with the dielectric layer during separation at the embrittlement plane. It further allows operations to take place up to a healing temperature of the substrates, or even beyond depending on the matrix+fillers formulation developed. It further allows thick layers to be used, typically greater than 10 µm in thickness, deposited in a single passage for example by coating (deposition in a few seconds).

Figure 4:
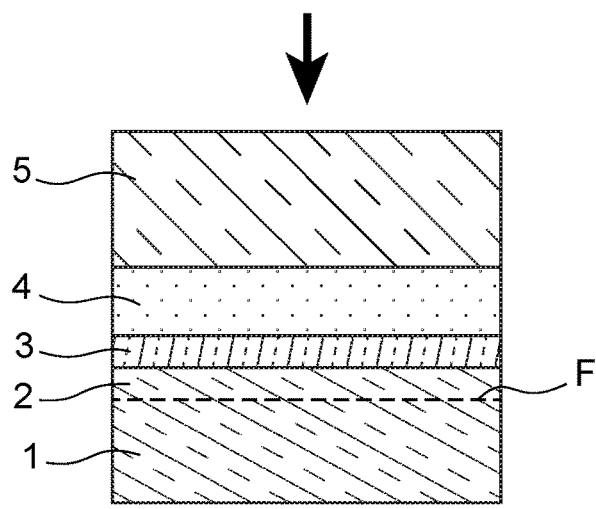
FIG. 4 shows the assembly of the donor substrate and the carrier substrate.

With reference to FIG. 4, the method comprises a step of assembling the donor substrate 1 and the carrier substrate 5 by way of the insulating layer 4. The preceramic polymer matrix forms an adhesive matrix that allows the stresses on the surface condition of the carrier substrate 5 to be released, thus facilitating, or doing away with, the surface preparation methods carried out on the carrier substrate 5.

The assembly can be produced by thermocompression, for example by maintaining the substrates 1, 5 under a pressure in the range of 10 kN to 30 kN. This is carried out at a temperature that exceeds the crosslinking temperature of the preceramic polymer matrix, typically at a temperature of greater than 100° C. This temperature does not exceed a temperature (typically greater than 300° C.) that could result in bubbling.

Figure 5:
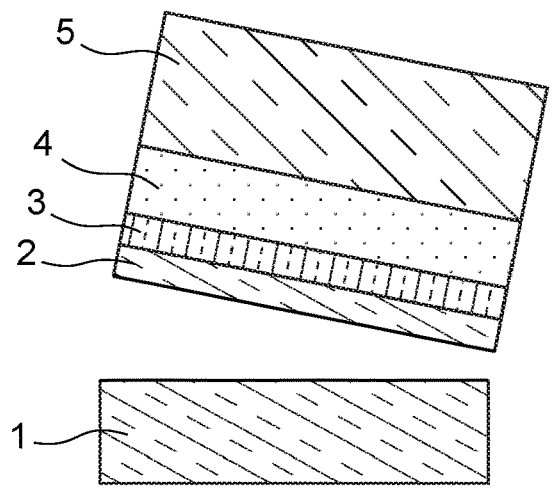
FIG. 5 shows the separation of the assembly at the embrittlement plane.

With reference to FIG. 5, the method comprises a step of separating the assembly by fracturing along the embrittlement plane. This separation is obtained by an input of energy, generally procured from a heat treatment.

Figure 6:
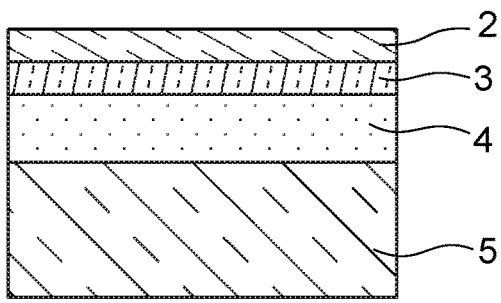
FIG. 6 shows the SeOI substrate obtained by implementing the method according to the invention.

This separation results in the transfer of the thin layer 2 from the donor substrate 1 to the carrier substrate and in the production of the SeOI structure shown in FIG. 6. As mentioned hereinabove, this structure, which can be obtained in a minimal number of steps, can have:

a thin layer 2 made of a semiconductor material having a thickness of between 10 nm and 3 µm;

an electrically insulating layer 4 having a heavy thickness from 20 to 300 µm and capable of accommodating the coefficient of thermal expansion of the thin layer;

a carrier substrate 5 which can have a crystal quality that is less than that of the thin layer.

One example embodiment of such a structure (thin layer 2 that is 1.2 µm thick on an insulating layer 4 that is about 250 µm thick) is as follows. It begins by the provision of a donor substrate made of silicon having a diameter of 200 mm and a thickness of 725 µm. After an RCA clean, this substrate is subjected to hydrogen ion implantation at an energy of 160 keV and at a dose of $6.10^{16}/cm^2$ to form the embrittlement plane therein. A 4 µm TEOS oxide layer is deposited on the donor substrate at a temperature of 200° C. A coating formulation is spread on the TEOS layer to form an insulating layer having a thickness of 250 µm. This formulation is obtained by dissolving, in a solvent referenced under the trade name Diestone® DLS (Socomore), poly(methyl)silsesquioxane (Silres® MK, Wacker Chemie AG) of the chemical formula $(CH_3SiO_{1.5})$, and particles of $Si_3N_4$ having a diameter of 1.6 µm representing 80 vol. % of the formulation. After spreading, the coating formulation is subjected to drying at an ambient temperature for 12 hours. The method then comprises the assembly, by thermocompression, with a silicon carrier substrate having a thickness of 725 µm for two hours, at a pressure of 30 kN and a temperature of 200° C. The separation at the embrittlement plane is obtained by means of a thermal anneal comprising a first heating rate of 10° C./min until a first hold temperature of 300° C. is reached, which is maintained for one hour, then a second heating rate of 10° C./min until a second hold temperature of 500° C. is reached, which is maintained for one hour.

The invention claimed is:

1. A method for transferring, from a donor substrate to a carrier substrate, a thin layer having a first coefficient of thermal expansion, comprising the steps of:
    forming an embrittlement plane in the donor substrate;
    forming an electrically insulating layer on the surface of the donor substrate and/or of the carrier substrate;
    producing an assembly by placing the donor substrate and the carrier substrate in contact with one another via the electrically insulating layer;
    separating the assembly by fracturing along the embrittlement plane;
    wherein forming the electrically insulating layer comprises coating the donor substrate and/or the carrier substrate with a coating formulation including a composite material formed by a matrix made of a particle-filled preceramic polymer, the composite material having a second coefficient of thermal expansion, the second coefficient of thermal expansion differing from the first coefficient of thermal expansion by no more than 20% of the first coefficient of thermal expansion.

2. The method according to claim 1, wherein the coating is produced such that the electrically insulating layer has a thickness of greater than 20 µm.

3. The method according to claim 2, wherein the coating is produced such that the electrically insulating layer has a thickness of less than 300 µm.

4. The method according to claim 1, wherein producing the assembly comprises thermocompression of the donor substrate and of the carrier substrate.

5. The method according to claim 4, wherein thermocompression is carried out at a pressure that lies in the range of 10 kN to 30 kN.

6. The method according to claim 4, wherein thermocompression is carried out at a temperature greater than 100° C.

7. The method according to claim 6, wherein separation comprises an annealing carried out at a temperature that is greater than the temperature at which the thermocompression is carried.

8. The method according to claim 1, wherein said coating is produced on a dielectric layer previously deposited on the donor substrate.

9. The method according to claim 1, wherein said coating formulation has a filling factor of greater than 50 vol. %.

10. The method according to claim 1, wherein the carrier substrate is made of a polycrystalline material.

* * * * *